(12) United States Patent
Walther et al.

(10) Patent No.: US 7,378,335 B2
(45) Date of Patent: May 27, 2008

(54) PLASMA IMPLANTATION OF DEUTERIUM FOR PASSIVATION OF SEMICONDUCTOR-DEVICE INTERFACES

(75) Inventors: Steven R. Walther, Andover, MA (US); Ukyo Jeong, Eugene, OR (US); Sandeep Mehta, Boxford, MA (US); Naushad K. Variam, Marblehead, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 86 days.

(21) Appl. No.: 11/288,828

(22) Filed: Nov. 29, 2005

(65) Prior Publication Data

US 2007/0123012 A1 May 31, 2007

(51) Int. Cl.
*H01L 21/425* (2006.01)
(52) U.S. Cl. ............... 438/528; 257/E21.334
(58) Field of Classification Search .......... 438/528; 257/E21.334
See application file for complete search history.

(56) References Cited

U.S. PATENT DOCUMENTS

| 6,326,274 | B2 | 12/2001 | Rost et al. | |
|---|---|---|---|---|
| 6,444,533 | B1* | 9/2002 | Lyding et al. | 438/308 |
| 2005/0255684 | A1* | 11/2005 | Koldiaev et al. | 438/528 |
| 2006/0270192 | A1* | 11/2006 | Cheng | 438/459 |

OTHER PUBLICATIONS

D. Misra and R.K. Jarwal, "Interface Hardening with Deuterium Implantation," Journal of the Electrochemical Society, 149 (8) G446-G450 (2002).

* cited by examiner

*Primary Examiner*—Bradley K Smith

(57) ABSTRACT

A method for fabricating a semiconductor-based device includes providing a substrate including a semiconductor layer, forming a gate dielectric layer on the semiconductor layer, forming a plasma including deuterium, plasma implanting deuterium from the plasma into the substrate, and annealing the substrate to promote passivation of the interface between the dielectric layer and the semiconductor layer.

19 Claims, 4 Drawing Sheets

PLASMA IMPLANTATION OF DEUTERIUM FOR PASSIVATION OF SEMICONDUCTOR-DEVICE INTERFACES

FIELD OF THE INVENTION

This invention relates to semiconductor devices, and, in particular, to the reliability of metal-oxide-semiconductor devices.

BACKGROUND OF THE INVENTION

Metal-oxide-semiconductor (MOS) based integrated circuits have a reliability that is depends in part on the interface between a semiconductor substrate, usually silicon, and a gate dielectric layer. Electrical defects associated with this interface can arise from the presence of unpaired silicon bonds at the interface. Interfacial trap states associated with these defects can be reduced by annealing the circuit, during fabrication, in a forming gas (10% $H_2$) to permit hydrogen atoms to diffuse to, and passivate, the silicon dangling bonds at the interface.

Hot carriers, however, can degrade the interface by displacing the hydrogen atoms at the interface. This loss of hydrogen can lead to threshold-voltage instability, transconductance degradation, and/or an increase in the subthreshold slope.

Deuterium passivation can be used as a more stable substitute for hydrogen passivation. The heavier deuterium isotope can reduce desorption of the passivating species arising from hot-carrier impact. Deuterium can be introduced by heating the circuit during fabrication in a gas containing deuterium to permit the deuterium to diffuse into the circuit.

SUMMARY OF THE INVENTION

One embodiment of the invention arises from the realization that deuterium can be plasma implanted to provide, for example, more convenient and/or controllable passivation of a semiconductor interface than possible for some prior techniques. Moreover, a plasma can be formed from an implant material that includes both an implant species and deuterium. Although not required, implantation of a dopant species and deuterium can be contemporaneous.

The invention can be applied, for example, in plasma implantation fabrication tools. Suitable plasma implantation tools include those that utilize, for example, a pulsed and/or a continuous plasma.

According to an aspect of the invention, a method is provided for fabricating a semiconductor device. The method includes providing a substrate including a semiconductor layer, forming a gate dielectric layer on the semiconductor layer, forming a plasma including deuterium, implanting the deuterium from the plasma into the substrate by plasma implantation, and annealing the substrate to promote passivation of the interface between the dielectric layer and the semiconductor layer.

BRIEF DESCRIPTION OF THE DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
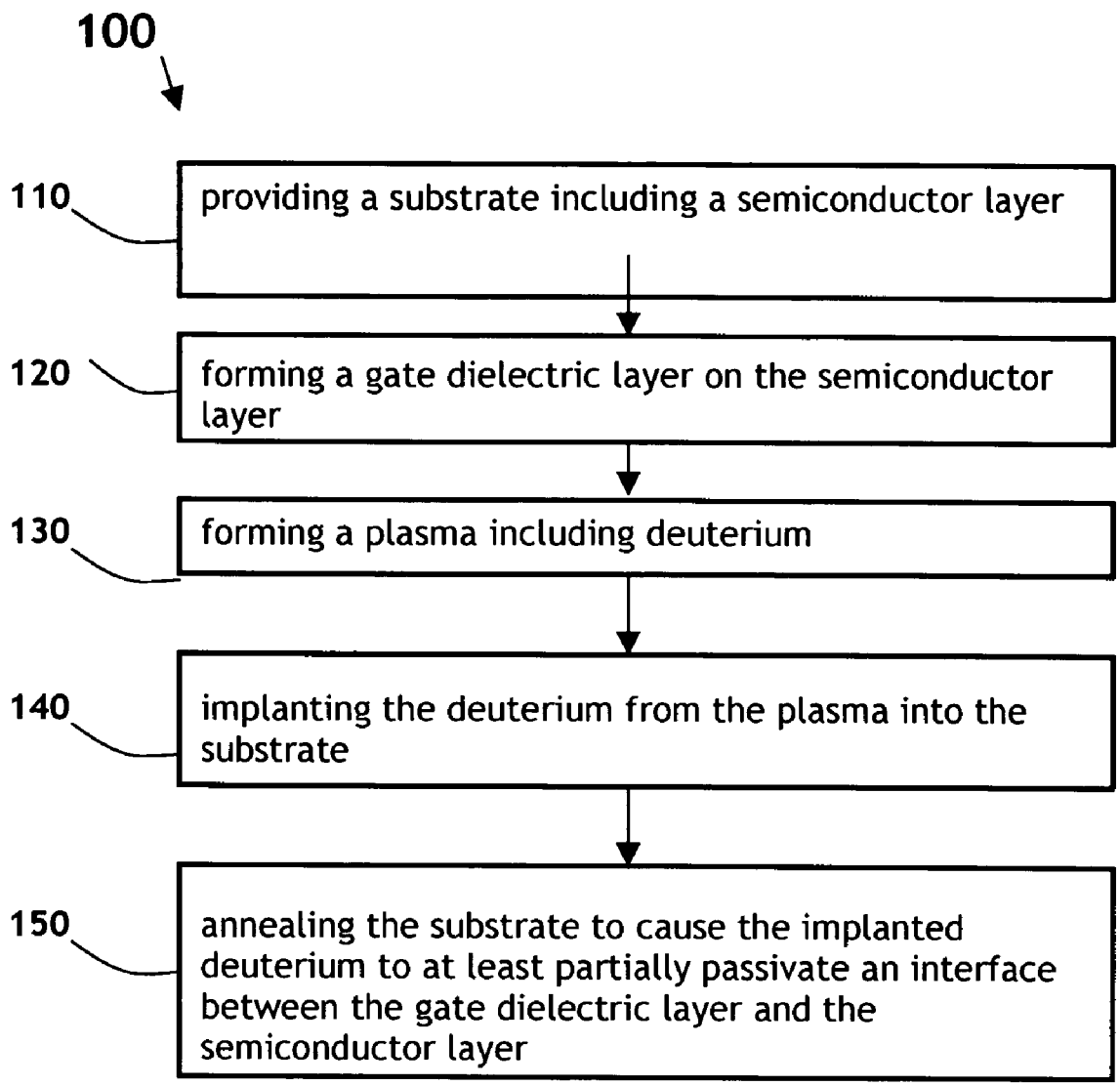
FIG. 1 is a flow diagram of a method for fabricating a semiconductor-based device, in accordance with one embodiment of the invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

The word "plasma," is used herein in a broad sense to refer to a gas-like phase that can include any or all of electrons, atomic or molecular ions, atomic or molecular radical species (i.e., activated neutrals), and neutral atoms and molecules. A plasma typically has a net charge that is approximately zero. A plasma may be formed from one or more materials by, for example, ionizing and/or dissociating events, which in turn may be stimulated by a power source having, for example, inductive and/or capacitive coupling.

The phrase "plasma implantation" is used herein to refer to implantation techniques that utilize implantation from a plasma without the mass selection features of a traditional beam implanter. A plasma implanter typically involves both a substrate and a plasma in the same chamber. The plasma can be near to the substrate, or the substrate can be immersed in the plasma. A variety of species types can be implanted from the plasma into the substrate. As used herein, the word "species" can refer to atoms, molecules, or collections of the same, which can be in a neutral, ionized, or excited state.

FIG. 1 is a flow diagram of a method 100 for fabricating a semiconductor-based device, according to one embodiment of the invention. The method 100 includes providing 110 a substrate(s), forming 120 a gate dielectric layer on the substrate, forming 130 a plasma that includes deuterium, implanting 140 deuterium from the plasma into the substrate, and annealing 150 the substrate to promote passivation of the interface between the dielectric layer and the substrate. The substrate has a semiconductor layer, which shares the interface with the dielectric layer. Annealing 150 causes at least a portion of the implanted deuterium to passivate the interface between the gate dielectric layer and the semiconductor layer.

The device can be, for example, a component of a circuit, such as a diode or a transistor. The transistor can be, for example, an MOS transistor. Alternatively, the device can be a portion of a circuit, or a complete circuit.

The substrate can be a semiconductor wafer, such as a silicon wafer. The substrate can include a semiconductor layer, such as a doped silicon layer, along with other materials. For example, the substrate can be a n-type or p-type silicon wafer, made n-type or p-type by incorporation of dopants, such as phosphorus or boron, as known to those having ordinary skill in the semiconductor fabrication arts. The substrate can be, for example, a silicon wafer, which may also incorporate buried insulating layers, for example, a silicon-on-insulator (SOI) wafer, as known to one having ordinary skill in the semiconductor fabrication arts.

The method 100 can be implemented with any suitable plasma-processing tool(s). One suitable tool is the VIISTA P²LAD processing system (available from Varian Semiconductor Equipment Associates, Inc. of Gloucester, Mass.)

In one embodiment, deuterium is implanted 140 prior to formation 120 of the gate dielectric layer. A peak location of the implanted deuterium can be positioned at the surface of the semiconductor layer, or below the surface of the semiconductor layer. If positioned below the surface, the peak can be positioned within a distance that permits sufficient movement of the implanted deuterium to the dielectric interface upon annealing 150.

Prior to implanting 140 the deuterium, a sacrificial layer, such as an oxide, can be formed on the semiconductor layer. A sacrificial oxide can have a thickness of, for example, about 1 nm (nanometer) to about 5 nm. The sacrificial oxide can be removed after implanting 140 the deuterium and/or other implantation steps.

Use of a sacrificial oxide can reduce implantation of undesired surface impurities into the semiconductor layer. The peak of the deuterium implant profile can be positioned at or just below the surface of the semiconductor layer, or in a sacrificial oxide layer, by appropriate selection of implant energy, as known to those having ordinary skill in the semiconductor fabrication arts.

Implantation parameters can be selected to control the location and concentration level of implanted species. For example, a desired degree of passivation can be achieved, at least in part, by selecting an appropriate dose and implant energy. The dose can be selected to provide an amount of deuterium that will passivate a significant portion of the dangling bonds at the dielectric interface.

For example, deuterium can be implanted 140 at a bias voltage of approximately 5 keV to approximately 50 keV to accommodate the location of the interface in many cases. An implant dose of deuterium can be, for example, from about $10^{14}$ cm$^{-2}$ to about $10^{16}$ cm$^{-2}$, which corresponds to a range of values encompassing an areal density associated with one monolayer of deuterium. One monolayer of deuterium approximately corresponds to the amount of dangling bonds present at the dielectric layer interface.

The dielectric layer can be formed 120 by any suitable technique. For example, a gate oxide can be grown in dry oxygen at 800° C., as known to one having ordinary skill in the semiconductor fabrication arts.

In one embodiment, the dielectric layer is formed 120 after implanting 140 the deuterium. In another embodiment, the gate dielectric layer is formed 120 prior to implantation 140 of deuterium, and the deuterium is implanted 140 through the gate dielectric layer. In this case, an implant peak can be positioned at the surface of the semiconductor layer, below the surface of the semiconductor layer, or above the surface of the semiconductor layer within the dielectric layer. Generally, the peak should be positioned within a distance of the interface that permits sufficient movement of the implanted deuterium to the dielectric layer interface upon annealing 150.

If the deuterium is implanted 140 after formation 120 of the dielectric layer, plasma implanting 140 and annealing 150 can occur at least partially simultaneously. For example, the substrate can be heated during plasma implantation 140.

In one embodiment, the plasma is formed 130 from an implant material that includes both deuterium and at least one dopant species. The plasma can then provide both deuterium for implantation 140 and one or more dopant species for implantation. The deuterium and the dopant species can be, for example, implanted simultaneously.

Thus, both the deuterium and the dopant can be implanted, for example, into a channel region of, for example, an MOS transistor. The implanted deuterium, as described above, can be used to passivate a gate dielectric layer interface of the MOS transistor. The channel implant of dopant can be used to adjust the threshold voltage of the MOS transistor, as understood by those having ordinary skill in the semiconductor fabrication arts.

For example, both n- and p-MOS transistors can have their threshold voltages adjusted with a p-type dopant implant and/or a n-type dopant implant. Any suitable implant material, including both deuterium and one or more dopant species, can be used. Some examples of suitable implant materials include, but are not limited to, $AsD_3$, $PD_3$, $B_5D_9$, and $B_2D_6$.

Thus, for example, the plasma can be formed 130 from deuterized diborane ($B_2D_6$), or a mixture of diborane ($B_2H_6$) and deuterized diborane ($B_2D_6$). A mixture can be used, for example, to control a concentration ratio in the plasma of dopant species to deuterium. The mixture permits the dose of deuterium to be controlled independently of the dose of the dopant material. In addition, a mixture of a deuterized gas and a dopant gas, wherein the deuterized gas is inert with respect to the dopant material, provides flexibility as to the implant depth of the deuterium. Examples of suitable inert deuterized gases include $D_2$ and $SiD_4$.

In some embodiments, a second plasma is formed for implanting a dopant species and/or other species. For example, a threshold voltage modifying dopant species and/or other dopant species can be plasma implanted from a second plasma rather than from the plasma formed 130 for deuterium implantation.

A second plasma can be formed from, for example, $AsH_3$, $PH_3$, $BF_3$, $AsF_5$, $PF_3$, $B_5H_9$, and $B_2H_6$. The plasma and/or the second plasma can also include a carrier gas. Some carrier gases include He, $H_2$, Ne, Ar, Kr, and Xe. Multiple implant steps can be used to introduce the deuterium and/or other implant species.

Suitable plasma-processing systems include those systems that are based on, for example, DC, RF and microwave power supplies. Power can be delivered to the plasma via, for example, capacitive coupling, inductive coupling, or a waveguide.

Suitable plasma implantation techniques include, for example, plasma immersion ion implantation (PIII) and pulsed plasma ion implantation. Thus, plasma implantation can utilize, for example, continuous or pulsed plasmas for continuous or pulsed implantation.

In one type of suitable plasma processing system, which utilizes a pulsed plasma, a semiconductor wafer is placed on a conductive platen, which functions as a cathode, located in a plasma processing chamber. An ionizable gas containing a desired material is introduced into the chamber, and a voltage pulse is applied between the platen and an anode to form a glow-discharge plasma having a plasma sheath in the vicinity of the wafer. An applied voltage pulse, for example, causes ions in the plasma to cross the plasma sheath and to be implanted into the wafer. The depth of implantation is related to the voltage applied between the platen and the anode.

Plasma implantation techniques can be used to exploit their capacity to implant species in addition to dopant species. For example, a great variety of neutrals, activated neutrals, and various ions can be implanted into a substrate.

As described above, plasma implantation can provide simultaneous implantation of dopant and passivating species, and the dopant and passivating species can be provided by a single implant material or more than one implant material and/or other materials, such as a carrier gas. A plasma formed from one or more materials can include a variety of components. For example, a plasma formed from $AsH_3$ and $AsD_3$ can include, for example, radicals of $AsH_3$, $AsD_3$, $AsH_2$, $AsD_2$, AsH, AsD, As, H and D, positive ions of $AsH_2$, $AsD_2$, AsH, AsD, As, H and D, and electrons, in addition to unexcited $AsH_3$ and $AsD_3$, and other molecules and atoms.

Thus, for example, arsenic and deuterium can be co-implanted from a single plasma. The arsenic and the deuterium can be included in a single and/or different implanted species. For example, at least some of the co-implanted As and D can be included in implanted $AsD_2$. Thus, an implant species, for example, an ionized molecule, may include both a passivating and dopant species.

In one example application, arsenic or phosphorus can be implanted to set a negative threshold voltage in depletion-mode components, which can be used as load transistors in some n-channel MOS circuits, as understood by those having ordinary skill in the semiconductor device arts. Sequential plasma implantation or co-implantation, as described above, can be used to passivate the dielectric interface next to the channel. Implantation can be performed through a dielectric layer.

If $AsD_3$ is used as an implant material for co-implantation of As and D, in some embodiments of the invention, the implantation parameters are selected to provide a D dose that is in a range from about 100% of the As dose to about 300% of the As dose. The D dose can be selected to be, for example, from about $10^{14}$ cm$^{-2}$ to about $10^{16}$ cm$^{-2}$.

D atoms may also be implanted without a dopant component, by using species such as $D_2$ (or HD, $SiD_4$, etc.) either to replace the deuterated dopant implant or as an additional step. The $D_2$ implant dose and energy can thus be tailored independently of dopant requirements to achieve passivation. This implant can take place either before or after the dielectric layer formation, as described above. The ion energy range is much lower in this case (D2), due to the light mass of the ion, and may range from 10 eV to 5 keV, while the dose range remains the same, for example from about $10^{14}$ cm$^{-2}$ to about $10^{16}$ cm$^{-2}$.

Annealing 150 can be implemented by any suitable technique, such as furnace annealing or RTP (rapid thermal processing) for example. To permit implanted deuterium to move to and passivate dangling bonds at the dielectric interface, substrates can be annealed at, for example, a temperature of approximately 900° C. or less, such as a range of 700° C. to 900° C. For example, annealing 150 can be performed at 850° C. for 20 minutes. Annealing 150 can be performed in a vacuum or any suitable ambient, for example, in a $N_2O$ ambient.

Figure 2:
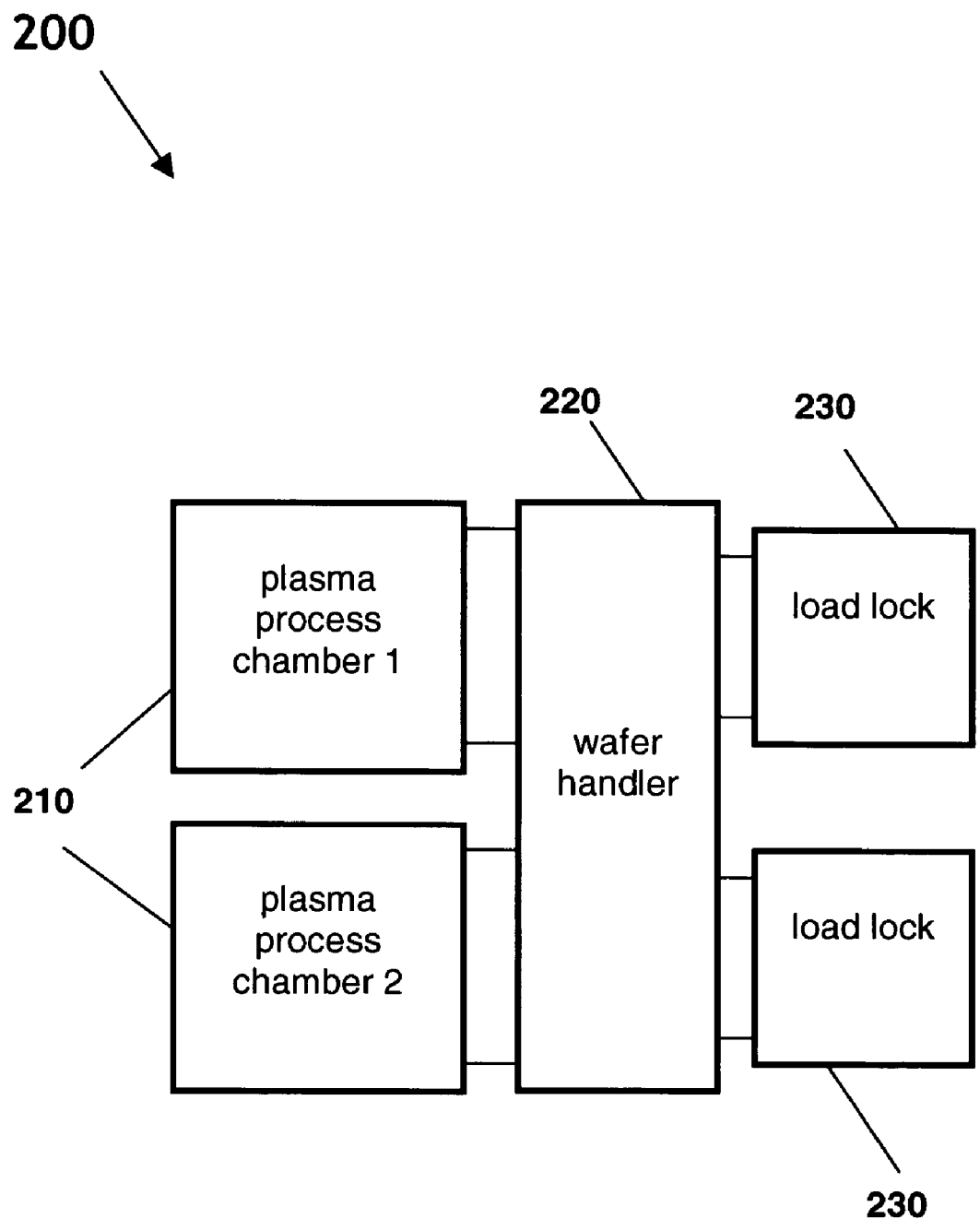
FIG. 2 is block diagram of a plasma-processing tool, in accordance with one embodiment of the invention.
Figure 3:
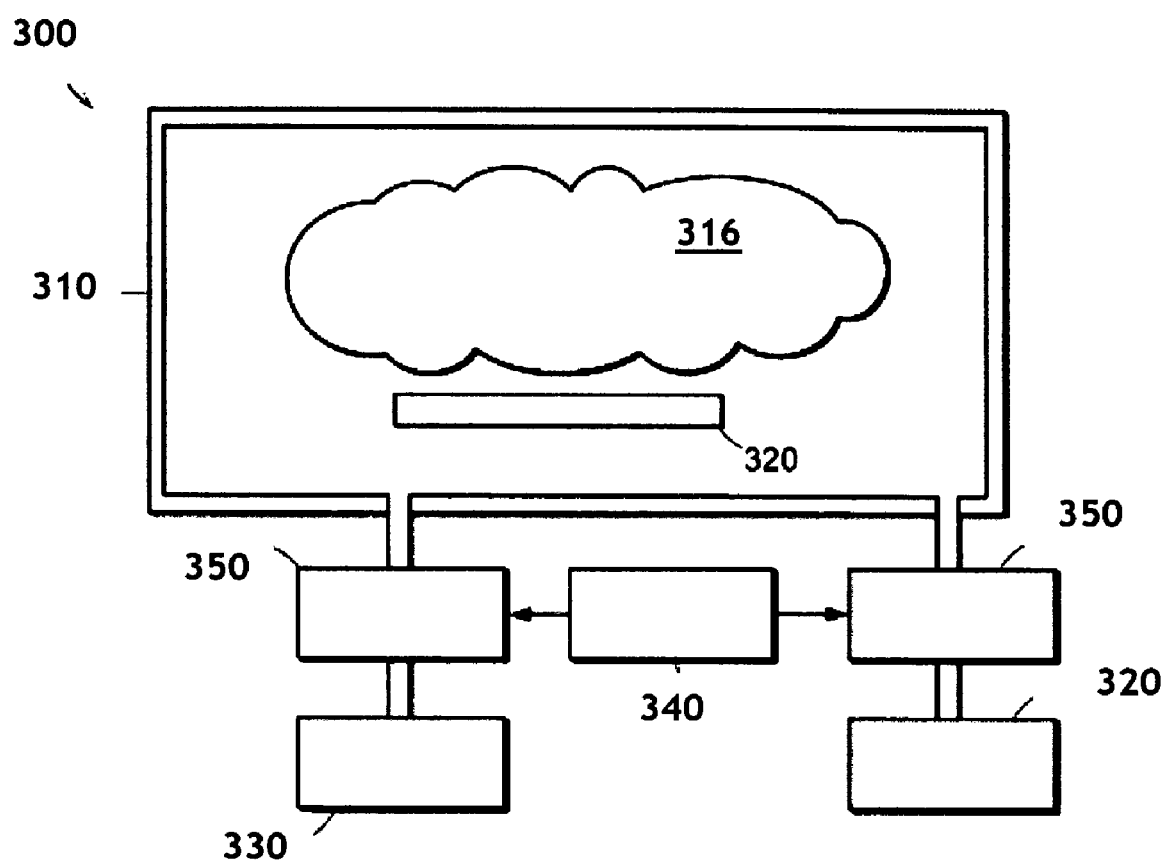
FIG. 3 is a block diagram of a plasma-processing tool, in accordance with one embodiment of the invention.

Now referring to FIGS. 2 and 3, some embodiments of process tools, which are suitable for implementation of the method 100, are described. In some embodiments, plasma implanting 140 and other process steps of the method 100 are performed in a single chamber of a plasma processing tool. In some alternative embodiments, plasma implanting 140 and other process steps of the method 100 are performed in different process chambers of a plasma processing tool. In such a case, the method 100 can include transferring substrates between plasma processing chambers.

FIG. 2 is a block diagram of a plasma processing tool 200, in accordance with one embodiment of the invention. The plasma processing tool 200 includes two plasma processing chambers 210, two load locks 230, and a wafer handler 220. The wafer handler 220 supports the exchange of substrates and/or platens holding substrates between the load locks 230 and the chambers 210. The wafer handler 220 and load locks 230 can have any suitable construction, including that found in conventional handlers and load locks.

Each of the chambers 210 can be used for a single or multiple types of processing. Thus, for example, one chamber 210 can be used for plasma implantation of deuterium and/or dopant(s), and the other chamber 210 can be used for plasma deposition, plasma etching, and/or annealing. Alternatively, for example, one chamber 210 can be used for boron implantation and the other chamber 210 can be used for arsenic implantation, to avoid cross contamination. Each chamber 210 can then also be used for other processing steps.

An optimized passivation process can be determined, for example, empirically. For example, process parameter values, for parameters such as plasma-implantation bias voltage, implant dosage, and annealing temperature and time can be varied and compared to measures of gate dielectric quality, such as the electrical behavior under current stress of a sample substrate after passivation. Such comparisons can then indicate preferred process parameter values.

FIG. 3 is a cross-sectional diagram of a plasma processing apparatus 300, in accordance with one embodiment of the invention. The apparatus 300 includes a vessel 310 associated with a chamber that can contain a plasma 316 and one or more substrates 320, which can be exposed to the plasma. The apparatus 300 also includes one or more implant material supplies 320, one or more carrier gas supplies 330, flow controllers 350, and one or more material supply control units 340. The plasma processing apparatus 300 can be used to, for example, implement the method 100.

The material supplies 320, 330 supply materials to the vessel 310 for formation and maintenance of a plasma. The flow controllers 350 regulate the flow of materials from the supplies 320, 330 to control, for example, the pressure of gaseous material delivered to the vessel 310. The material supply control unit 340 is configured to control, for example, a mixture of carrier gas and deuterium-containing gas supplied to the vessel 310 by communicating with the flow controllers 350. The vessel 310 can be used for plasma implantation, plasma deposition, plasma etching, and/or other fabrication-related processes. Thus, the apparatus 300 can be used, for example, for plasma doping of a substrate(s) and for implanting deuterium into the substrate(s). The material supplies 320, 330, flow controllers 350, and control units 340 can be of any suitable kind, including those known to one having ordinary skill in the plasma processing arts.

In one mode of operation, the apparatus 300 utilizes a pulsed plasma. A semiconductor wafer is placed on a conductive platen that functions as a cathode, and is located in the vessel 310. An ionizable gas containing, for example, one of the above-described implant materials, is introduced into the chamber, and a voltage pulse is applied between the platen and an anode to form a glow discharge plasma having a plasma sheath in the vicinity of the wafer. An applied voltage pulse can cause ions in the plasma to cross the plasma sheath and to be implanted into the wafer. A voltage applied between the wafer and the anode can be used to control the depth of implantation.

Plasma implantation techniques can be used to exploit their capacity to implant species in addition to dopant species. For example, as described above, a great variety of neutrals, activated neutrals, and various ions can be implanted into a substrate.

Implantation parameters can be selected to control the location and concentration level of implanted species. For example, a desired areal density of implanted deuterium can be achieved in part by selecting an appropriate dose and implant energy. For example, an implant energy may be selected to position an implant in the underlying substrate at a location close to or at an interface. The dose can be selected to provide a desired concentration profile.

Exemplary embodiments of the invention, described herein, that refer to particular dopants or devices are not intended to be limiting with respect to those dopants or devices. It should be understood that principles of the invention may be applied to a broad range of implant materials and device structures to obtain interfaces having relatively stable passivation.

Figure 4:
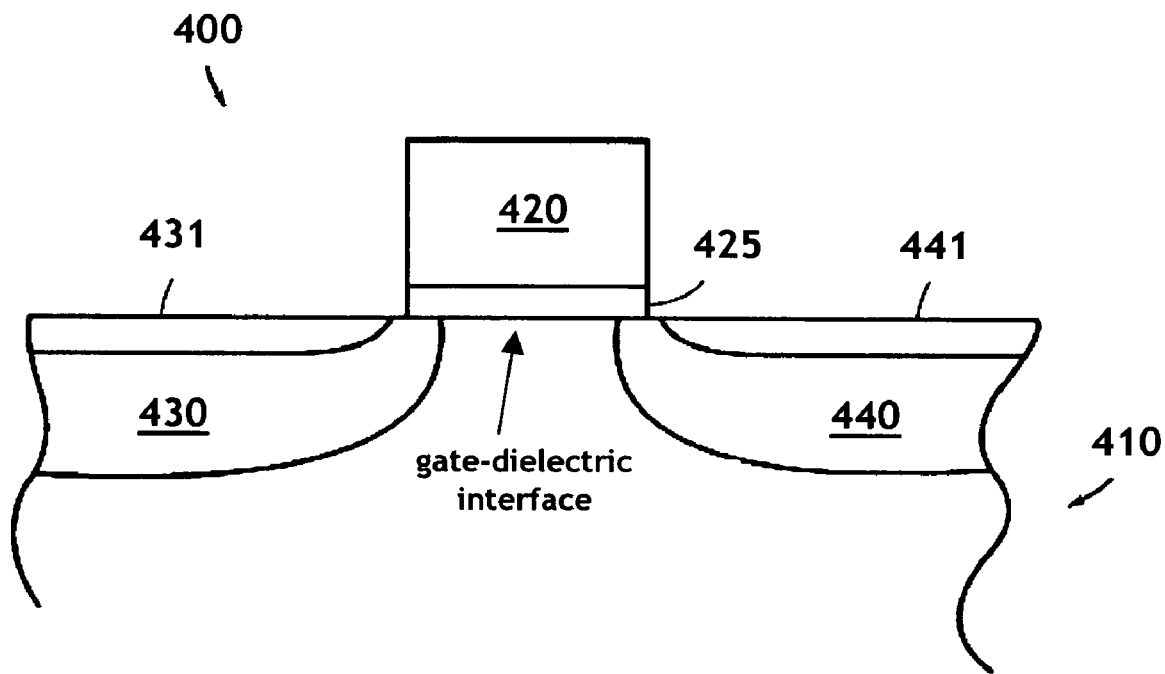
FIG. 4 is a cross-sectional diagram of a MOSFET, in accordance with one embodiment of the invention.

Next referring to FIG. 4, an MOS transistor may be fabricated by the method 100 using, for example, a silicon substrate having a substantially uniform distribution of phosphorus dopant. After implantation 140 of deuterium and formation 120 of a gate dielectric layer, the source and drain of the MOS transistor can be formed by implanting boron of a relatively high concentration into regions of the substrate. Since the boron in the source and drain regions has a higher concentration than phosphorus in those regions, the source and drain regions are converted from n-type to p-type material.

Further, n-type MOS transistors can be formed in the same (n-type) substrate by, for example, first forming a well of p-type dopant in the n-type substrate. Source and drain regions may then be formed in the well by introducing n-type dopant to define n-type source and drain regions within the p-type well. Thus, principles of the invention can be applied, for example, to improve transistors formed in wells, as well as those that require fewer doping steps during fabrication.

FIG. 4 is a cross-sectional view of an embodiment of an MOS transistor 400 having a passivated gate dielectric interface that can be fabricated by the method 100, utilizing, for example, one of the process tools 200, 300. The MOS transistor 400 includes a silicon-based substrate 410 having a first dopant, a source region 430 and a drain region 440 defined by a second dopant, a source contact 431 in contact with the source region 430, a drain contact 441 in contact with the drain region 440, a gate contact 420 adjacent to the substrate 410, and a gate dielectric layer 425 between the gate contact 420 and the substrate 410. The gate-dielectric interface is passivated with deuterium introduced by plasma implantation, as described above.

The substrate 410 can be, for example, a p-type boron-doped silicon wafer. Source and drain regions can be formed by implanting arsenic at a relatively high concentration into the desired regions, followed by annealing to activate at least some of the dopant.

The source and drain contacts 431, 441 can include silicide. The gate contact 420 can include, for example, a doped conductive polycrystalline silicon lower portion and a silicide upper portion. Alternatively, the gate contact 420 may be formed of another conductive material, such as a heavily doped semiconductor; a metal, e.g., titanium (Ti), tungsten (W), molybdenum (Mo), tantalum (Ta), or iridium (Ir); or metal compounds that provide an appropriate work-function, e.g., titanium nitride (TiN), titanium silicon nitride (TiSiN), tungsten nitride (WN), tantalum nitride (TaN), tantalum silicide (TaSi), nickel silicide (NiSi), or iridium oxide ($IrO_2$).

A portion of the substrate 410 may be epitaxially grown, and the first dopant, such as phosphorus, may be incorporated into the epitaxial layer as it is grown. The source and drain contacts 431, 441 can be formed, for example, by depositing a metal layer and reacting the metal layer with the substrate 410.

The dielectric layer 425 can be formed by any suitable method including various methods conventional in the art, for example, thermal oxidation or a deposition technique. The gate dielectric 425 can be, for example, a 1 nm to 10 nm thick layer of silicon dioxide. Alternatively, the dielectric 425 can be, for example, silicon oxynitride, silicon nitride, layers of silicon nitride and silicon oxide, or a high-k dielectric. Alternative dielectric materials may be employed when, for example, a thin effective gate oxide thickness is desired, for example, a thickness equivalent to an $SiO_2$ layer thickness of 2 nm or less. As described above, the deuterium can be implanted, for example, prior to or after formation of the dielectric layer 425.

The MOS transistor 400, as understood by those having ordinary skill in the semiconductor arts, can be implemented as a n-MOS or a p-MOS transistor. The MOS transistor 400 can include, for example, different doping types and levels in source, drain, and channel regions.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for fabricating a semiconductor device, comprising:
   providing a substrate including a semiconductor layer;
   forming a gate dielectric layer on the semiconductor layer;
   forming a plasma including deuterium, wherein the plasma comprises a glow discharge plasma or an RF plasma;
   implanting the deuterium from the plasma into the substrate by plasma implantation at least partially simultaneously with forming the gate dielectric layer; and
   annealing the substrate to cause the implanted deuterium to at least partially passivate an interface between the gate dielectric layer and the semiconductor layer.

2. The method of claim 1, wherein forming comprises forming the plasma from an implant material comprising the deuterium and at least one dopant species.

3. The method of claim 2, wherein the implant material comprises at least one compound selected from $AsD_3$, $PD_3$, $B_5D_9$, and $B_2D_6$.

4. The method of claim 2, further comprising implanting a portion of the at least one dopant species into the semiconductor layer.

5. The method of claim 4, wherein the semiconductor layer is associated with a channel region of the device, and implanting the portion of the at least one dopant species comprises selecting a dose of the at least one dopant species to control a threshold voltage of the device.

6. The method of claim 1, wherein annealing comprises annealing the substrate at a temperature in a range of about 700° C. to about 900° C.

7. The method of claim 1, wherein annealing and forming the gate dielectric layer occur at least partially simultaneously.

8. The method of claim 1, wherein the plasma implanted deuterium has an areal density associated with a density range of about $10^{14}/cm^2$ to about $10^{16}/cm^2$.

9. The method of claim 1, wherein forming the gate dielectric layer begins after implanting the deuterium.

10. The method of claim 1, wherein implanting the deuterium begins after forming the gate dielectric layer.

11. The method of claim 1, wherein forming comprises forming the plasma in part from a carrier gas comprising the deuterium.

12. The method of claim 1, wherein the plasma is an immersion plasma.

13. The method of claim 1, further comprising forming a sacrificial layer on the semiconductor layer prior to forming the gate dielectric layer, and removing the sacrificial layer after implanting the deuterium.

14. The method of claim 1, wherein implanting comprises applying a bias voltage.

15. The method of claim 14, wherein the bias voltage has a value less than about 50 keV.

16. The method of claim 1, wherein implanting comprises providing an implantation peak at a substrate depth of less than about 1.0 micrometer.

17. The method of claim 1, wherein the semiconductor layer comprises silicon, and forming the gate dielectric layer comprises oxidizing a portion of the semiconductor layer.

18. A semiconductor device fabricated by the method of claim 1.

19. The method of claim 1, wherein forming comprises forming the plasma from at least one species selected from $D_2$, HD, and $SiD_4$.

* * * * *